United States Patent
Nishikawa

(10) Patent No.: US 7,256,618 B2
(45) Date of Patent: Aug. 14, 2007

(54) SEMICONDUCTOR INTEGRATED CIRCUIT DEVICE

(75) Inventor: Hidetoshi Nishikawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/567,991

(22) PCT Filed: Jul. 15, 2004

(86) PCT No.: PCT/JP2004/010105

§ 371 (c)(1),
(2), (4) Date: Feb. 9, 2006

(87) PCT Pub. No.: WO2005/018094

PCT Pub. Date: Feb. 24, 2005

(65) Prior Publication Data

US 2006/0232299 A1    Oct. 19, 2006

(30) Foreign Application Priority Data

Aug. 18, 2003  (JP) .............................. 2003-294531

(51) Int. Cl.
*H03K 19/00*  (2006.01)
*G11C 19/00*  (2006.01)

(52) U.S. Cl. .................... 326/93; 326/98; 326/113; 377/54

(58) Field of Classification Search .............. 326/46, 326/93–98, 113; 377/54
See application file for complete search history.

(56) References Cited

U.S. PATENT DOCUMENTS 5,321,399 A *  6/1994  Notani et al. ............... 341/100
6,919,875 B2 *  7/2005  Abe et al. ................... 345/100

FOREIGN PATENT DOCUMENTS

| JP | 51-21466 | 2/1976 |
| JP | 61-214622 | 9/1986 |
| JP | 6-141333 | 5/1994 |
| JP | 2004-140752 | 5/2004 |

* cited by examiner

*Primary Examiner*—Rexford Barnie
*Assistant Examiner*—Jason Crawford
(74) *Attorney, Agent, or Firm*—Fish & Richardson P.C.

(57) ABSTRACT

A semiconductor integrated circuit device (1) includes: a transistor switch (SWA) for electrically connecting and disconnecting output of a flip-flop (FF64) of a shift register (SR1) and input of a flip-flop (FF65) of a shift register (SR2); and a transistor switch (SWB) for electrically connecting and disconnecting an input driver (Din2) and input of the flip-flop (FF65). Here, when the shift registers (SR1 and SR2) are connected, the transistor switch (SWA) is turned ON and the transistor switch (SWB) is turned OFF by a selection signal.

9 Claims, 7 Drawing Sheets

SEMICONDUCTOR INTEGRATED CIRCUIT DEVICE

CONTINUING DATA

This application is a 371 of PCT/JP04/10105 filed on Jul. 15, 2004.

TECHNICAL FIELD

The present invention relates to a semiconductor integrated circuit device built as a shift register that converts inputted serial data into parallel data, more particularly, relates to a semiconductor integrated circuit device provided with a plurality of shift registers.

BACKGROUND ART

Conventionally, in printer head drivers or the like, shift registers are provided that receive data on a bit-by-bit basis as serial data and store it therein. In this shift register, the inputted serial data is divided on a bit-by-bit basis, then converted into parallel data, and then fed to a latch circuit. Each bit of data, having been stored in the latch circuit, is then outputted from the latch circuit to a drive circuit with predetermined timing determined on a bit-by-bit-basis, permitting electric current to be fed to a heating resistance or a light-emitting element.

As a printing apparatus provided with such a conventional printer head driver, there has been proposed a printing apparatus in which a plurality of heating elements are divided into a plurality of blocks, and a plurality of shift registers of the same number of bits as the number of heating elements of each block are provided (see Patent Publication 1). In this printing apparatus, data of each block is stored in each shift register, and the individual shift registers are driven with different timing. This makes it possible to separate a shift register performing data output and a shift register performing data input, making it possible to speed up printing operation.

As described above, when a shift register is provided on a block-by-block basis, a plurality of shift registers are built in a semiconductor integrated circuit device. Specifically, as shown in FIG. 8, a 64-bit shift register SRX composed of flip-flops FF1 to FF64 and a 64-bit shift register SRY composed of flip-flops FF65 to FF128 are built in a single semiconductor integrated circuit device 100. Now, the semiconductor integrated circuit device 100 has an input terminal SI1 that receives serial data to the shift register SRX, a clock input terminal CLK that receives a clock, an output terminal SO1 that outputs serial data from the shift register SRX, and an input terminal SI2 that receives serial data to the shift register SRY. Moreover, the flip-flop FF1 of the shift register SRX and the flip-flip FF65 of the shift register SRY each have, on the input side thereof, an input driver Din, and the flip-flop FF64 of the shift register SRX has, on the output side thereof, an output driver Dout.

Patent Publication 1: Japanese Patent Application Laid-Open No. H5-229159

DISCLOSURE OF THE INVENTION

Problems to be Solved by the Invention

However, in the semiconductor integrated circuit device 100 built with the shift registers SRX and SRY as shown in FIG. 8, when the shift register SRX and the shift register SRY are used as a 128-bit shift register by inputting serial data from the former to the latter, it is necessary to connect the output terminal SO1 and the input terminal SI2 together via an external conductor laid on a substrate outside the semiconductor integrated circuit device 100. This leads to a delay in transferring data from the output buffer Dout of the shift register SRX to the input buffer Din of the shift register SRY via an external parasitic load capacitance such as an external conductor laid on a substrate.

In this case, a relationship between a clock to be inputted from the clock input terminal CLK, an input si64 and an output so64 of the flip-flop FF64, and an input si65 and an output so65 of the flip-flop FF65 is shown in FIGS. 9 or 10. Specifically, in a case where the clock frequency is low as shown in FIG. 9, when a set-up time t elapses from when the clock varying as shown in FIG. 9(a) rises to high level, the flip-flop FF64 changes the output so64, as shown in FIG. 9(c), to a value corresponding to a value taken by the input si64 when the clock rises to high level as shown in FIG. 9(b).

Then, as shown in FIG. 9(d), the output so64 from the flip-flop FF64 is delayed by time td, and is then inputted as the input si65 to the flip-flop FF65, which changes the output so65 as shown in FIG. 9(e), as with the flip-flop FF64, when the set-up time t elapses from when the clock rises to high level, to a value corresponding to a value taken by the input si65 when the clock rises to high level as shown in FIG. 9(d).

In the example shown in FIG. 9, the clock frequency is low as shown in FIG. 9(a), and its cycle T is longer than the sum of set-up time t and delay time td (=t+td). This makes it possible to make the output so65 of the flip-flop FF65 correspond to the output so64 of the flip-flop 64. Therefore, it is possible to operate the shift registers SRX and SRY without loss of data.

Now, suppose that, as shown in FIG. 10(a), the clock frequency is made higher, and its cycle T is made shorter than the sum of set-up time t and delay time td (=t+td). Then, the input si64 and the output so64 behave as shown in FIGS. 10(b) and 10(c), respectively, whereby the flip-flop FF64 can operate corresponding to the clock. However, the input si65 to the flip-flop FF65 behaves as shown in FIG. 10(d), whereby the input si65 changes after rising of the clock. As a result, as shown in FIG. 10(e), the output so65 of the flip-flop FF65 does not correspond to the output so64 from the flip-flop FF64, leading to data loss in the flip-flop FF65.

Means for Solving the Problem

In view of the conventionally experienced problems described above, an object of the present invention is to provide a semiconductor integrated circuit device that is built with a plurality of shift registers, and that permits the shift registers, when they are made to operate with the output of one shift register connected to the input of another, to operate without malfunctioning even at a high frequency.

To achieve the above object, according to one aspect of the present invention, a semiconductor integrated circuit device is provided with: first to n-th shift registers; first to n-th input terminals that receive data fed to the first to n-th shift registers; a first switch that electrically connects and disconnects the output of a k-th shift register (where k is an integer such that $1 \leq k \leq n-1$) and the input of a k+1-th shift register; a second switch that electrically connects and disconnects the input of the k+1-th shift register and a k+1-th input terminal that receives data to the k+1-th shift register; and a selection signal input terminal that receives a selection signal for switching ON/OFF of the first switch and the second switch. When the k-th shift register and the k+1-th shift register are used in a combined manner, the first switch is turned ON and the second switch is turned OFF by the selection signal. On the other hand, when the k-th shift register and the k+1-th shift register are used separately, the first switch is turned OFF and the second switch is turned ON by the selection signal.

According to another aspect of the present invention, a semiconductor integrated circuit device is provided with: first to n-th shift registers; first to n-th input terminals that receive data fed to the first to n-th shift registers; and a switching control portion that performs, according to whether or not a k+1-th input terminal that receives data to a k+1-th shift register (where k is $1 \leq k \leq n-1$) is connected to the outside, switching control of whether the output of the k-th shift register and the input of the k+1-th shift register are connected together, or the k+1-th input terminal and the input of the k+1-th shift register are connected together. When the switching control portion recognizes that the k+1-th input terminal is in an open state in which the k-th input terminal is not connected to the outside, the output of the k-th shift register and the input of the k+1-th shift register are connected together, and the k+1-th input terminal and the input of the k+1-th shift register are disconnected from one another. When the switching control portion recognizes that the k+1-th input terminal is connected to the outside and data is inputted thereto, the output of the k-th shift register and the input of the k+1-th shift register are disconnected from one another, and the k+1-th input terminal and the input of the k+1-th shift register are connected together.

Effect of the Invention

According to the present invention, a plurality of shift registers are provided, among which the output of a shift register can be internally connected to the input of the adjacent one, eliminating the need to connect them together via an external conductor laid on a substrate as in the conventional example. Therefore, unlike the conventional example, it is possible to prevent a delay between the shift registers caused by the influence of an external parasitic load capacitance or the like. This permits the shift registers, even when the adjacent ones are made to operate in a combined manner, to operate with high frequency clock. Moreover, according to the present invention, by feeding an input from the outside to the individual shift registers or making the number of signals coming from the outside smaller than the number of shift registers, it is possible to select whether or not to connect the input of one shift register with the output of another. This makes it possible to select whether the shift registers inside the semiconductor integrated circuit device are used separately or in a combined manner.

Moreover, according to the present invention, it is possible to replace an output terminal required in the conventional example to output an output from each shift register to the outside with a selection signal input terminal. Therefore, as compared with the conventional semiconductor integrated circuit device, it can be realized without increasing the number of terminals. Furthermore, by making it possible to perform switching according to whether or not an input terminal is connected to the outside, it is possible to omit the selection signal input terminal that receives a selection signal, thereby reducing the number of terminals.

LIST OF REFERENCE SYMBOLS 1, 1a, 1b semiconductor integrated circuit device
2, 20 switching control portion

BEST MODE FOR CARRYING OUT THE INVENTION

First Embodiment

Figure 1:
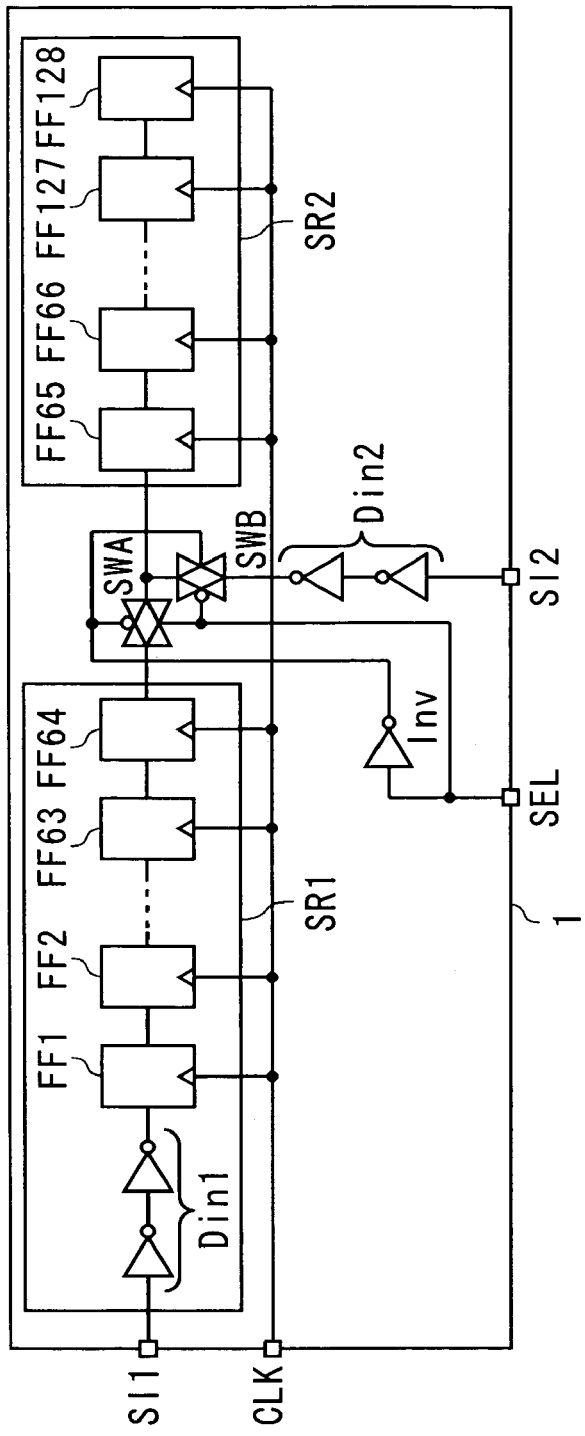
[FIG. 1] A block circuit diagram showing the internal configuration of the semiconductor integrated circuit device provided with the shift registers of a first embodiment.

A first embodiment of the present invention will be described with reference to the drawings. FIG. 1 is a block circuit diagram showing the internal configuration of the semiconductor integrated circuit device of this embodiment.

A semiconductor integrated circuit device 1 of FIG. 1 includes: a 64-bit shift register SR1 composed of flip-flops FF1 to FF64 and an input driver Din1; a 64-bit shift register SR2 composed of flip-flops FF65 to FF128; an input terminal SI1 that receives serial data to the shift register SR1; a clock input terminal CLK that receives a clock; an input terminal SI2 that receives serial data to the shift register SR2; an input driver Din2 connected to the input terminal SI2; a transistor switch SWA that electrically connects and disconnects the output of the flip-flop FF64 and the input of the flip-flop FF65; a transistor switch SWB that electrically connects and disconnects the output of the input driver Din2 and the input of the flip-flop FF65; a selection signal input terminal SEL that receives a selection signal for controlling ON/OFF of the switches SWA and SWB; and an inverter Inv connected to the selection signal input terminal SEL.

Figure 2:
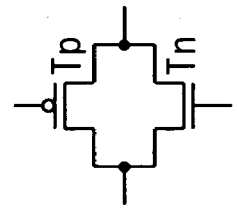
[FIG. 2] A circuit diagram showing the configuration of the transistor switch.

As shown in FIG. 2, the transistor switches SWA and SWB are each composed of a P-channel MOS transistor Tp and an N-channel MOS transistor Tn connected in parallel. In the transistor switch SWA, a selection signal inverted by the inverter Inv is inputted to the gate of the MOS transistor Tp, and a selection signal inputted via the selection signal input terminal SEL is inputted to the gate of the MOS transistor Tn. In the transistor switch SWB, a selection signal inverted by the inverter Inv is inputted to the gate of the MOS transistor Tn, and a selection signal inputted via the selection signal input terminal SEL is inputted to the gate of the MOS transistor Tp.

When such a connection is established and a 128-bit shift register is built with the shift registers SR1 and SR2, high level is inputted from the selection signal input terminal SEL as a selection signal, the switch SWA turns ON, and the switch SWB turns OFF. Accordingly, the data outputted from the flip-flop FF64 of the shift register SR1 is inputted to the input of the flip-flop FF65 via the switch SWA.

As a result, inside the semiconductor integrated circuit device 1, the output of the flip-flop FF64 and the input of the flip-flop FF65 are connected together.

Figure 8:
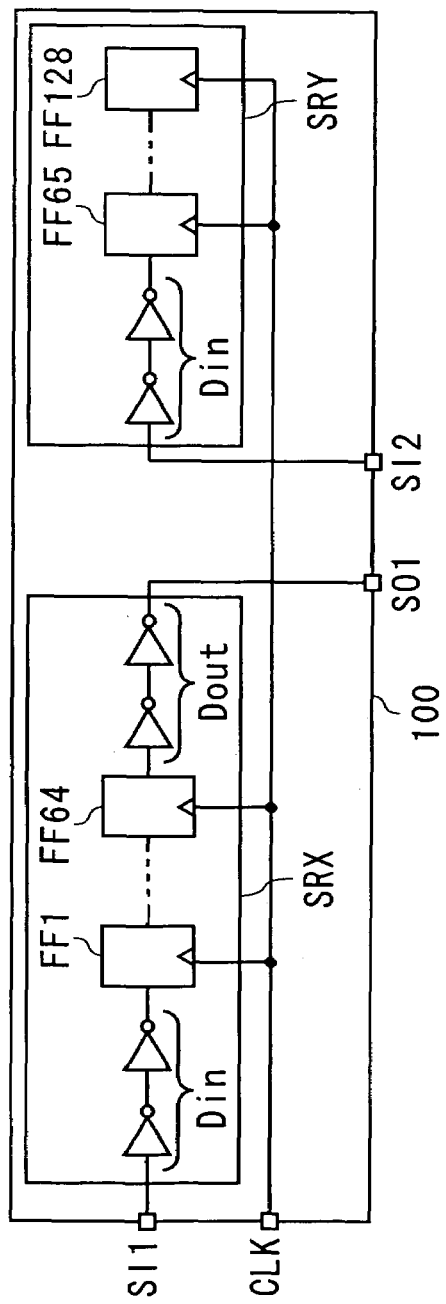
[FIG. 8] A block circuit diagram showing the internal configuration of the semiconductor integrated circuit device provided with conventional shift registers.
Figure 9:
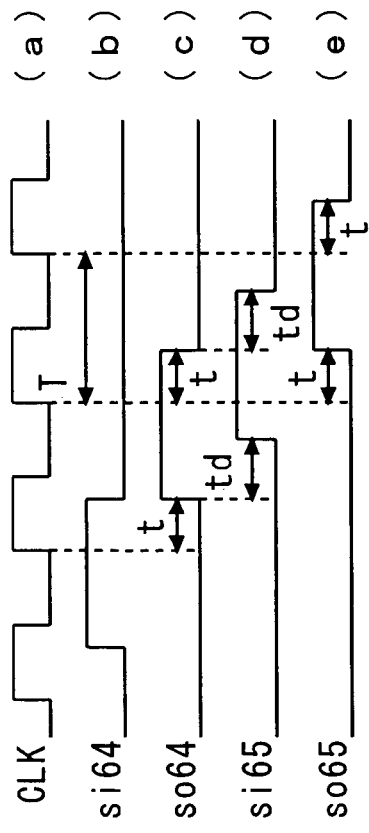
[FIG. 9] A timing chart partially showing the operation performed inside the semiconductor integrated circuit of FIG. 8.
Figure 10:
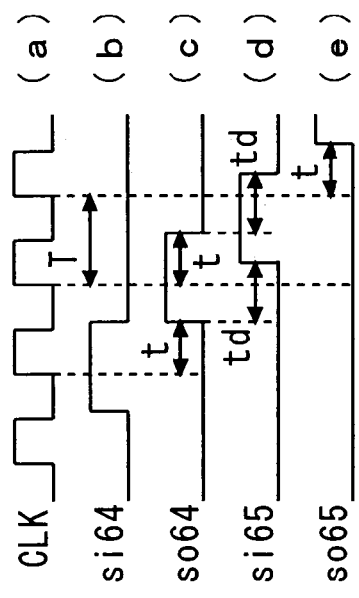
[FIG. 10] A timing chart partially showing the operation performed inside the semiconductor integrated circuit of FIG. 8.

Therefore, unlike the conventional configuration as shown in FIG. 8, it is possible to omit an output driver Dout and an input driver Din lying between the output of the flip-flop FF64 and the input of the flip-flop FF65, and there is no need to connect them together via an external conductor laid on a substrate outside the semiconductor integrated circuit device. This makes it possible to prevent a delay between the output of the flip-flop FF64 and the input of the flip-flop FF65.

On the other hand, when two 64-bit shift registers are built with the shift registers SR1 and SR2 in such a way that data is inputted to the shift registers SR1 and SR2 from the input terminals SI1 and SI2, respectively, low level is inputted from the selection signal input terminal SEL as a selection signal, the switch SWA turns OFF, and the switch SWB turns ON. As a result, data inputted from the input terminal SI2 is inputted to the input of the flip-flop FF65 via the input driver Din2 and the switch SWB.

With this configuration, when a plurality of shift registers built in the semiconductor integrated circuit device 1 are used in a combined manner as a single shift register, switching a selection signal makes it possible to prevent a data delay between the input of a shift register and the output of the adjacent one. Therefore, even when a clock frequency is made higher, it is possible to prevent data loss between the input of a shift register and the output of the adjacent one. Moreover, it is possible to replace an terminal used in the conventional configuration as shown in FIG. 8 as an output terminal SO1 with a selection signal input terminal SEL, making it possible to achieve this configuration by using as many terminals as those of the conventional one.

This embodiment deals with a case where two 64-bit shift registers are built in the semiconductor integrated circuit device 1. It should be understood, however, that a shift register of a different number of bits may be used instead of a 64-bit shift register. Moreover, it should be understood that, instead of a transistor switch, a switch having a different configuration may be used as the transistor switches SWA and SWB.

Figure 3:
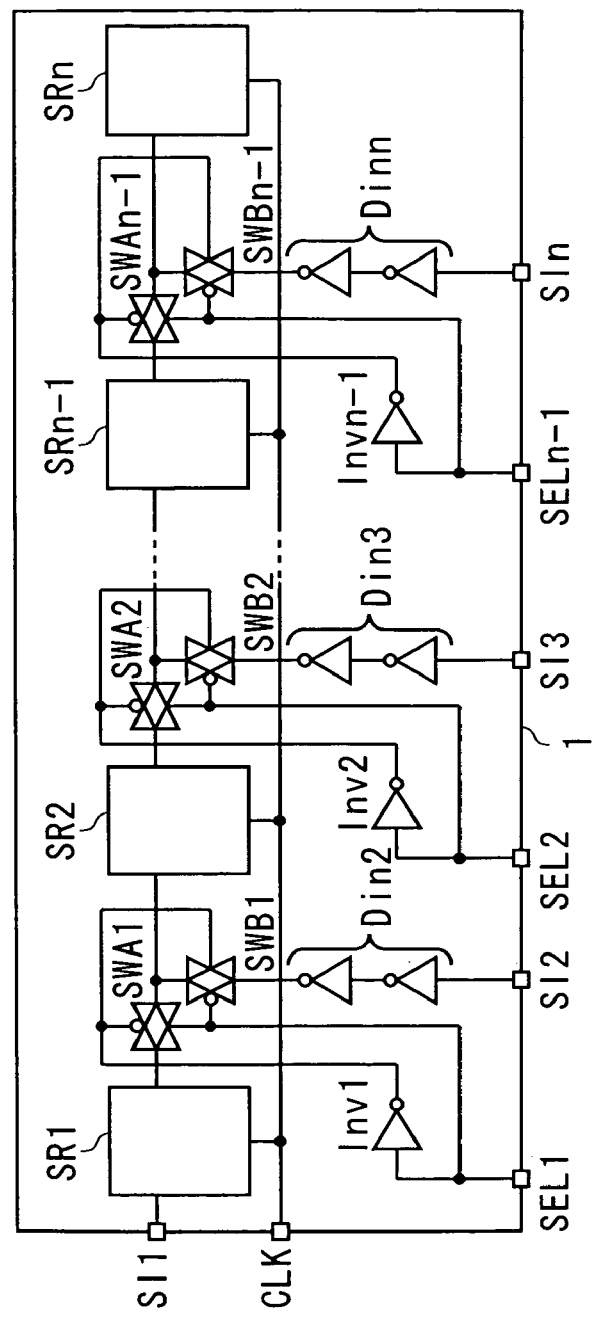
[FIG. 3] A block circuit diagram showing another example of the internal configuration of the semiconductor integrated circuit device provided with the shift registers of the first embodiment.

Furthermore, as shown in FIG. 3, it may be built with n shift registers SR1 to SRn, and there may be provided switches n−1 SWA1 to SWAn−1 and n−1 switches SWB1 to SWBn−1 between the adjacent shift registers. In this case, there are provided n−1 selection signal input terminals SEL1 to SELn−1 and n−1 inverters Inv1 to Invn−1, and selection signals and inverted selection signals fed therefrom are respectively inputted to the switches SWA1 to SWAn−1 and the switches SWB1 to SWBn−1.

Moreover, input terminals SI2 to SIn and input drivers Din2 to Dinn are used when data is inputted to the shift registers SR2 to SRn from the outside. Therefore, by switching ON/OFF of the switches SWA1 to SWAn−1 and the switches SWB1 to SWBn−1 according to a selection signal, it is possible to build a shift register of a desired number of bits by decoupling or coupling the shift registers SR1 to SRn.

It should be understood that the number of selection signal input terminals may be made smaller than n−1, and there may be provided a switching control portion that controls switching of the switches SWA1 to SWAn−1 and SWB1 to SWBn−1 according to the number of pulses of a selection signal inputted to the selection signal input terminal.

Second Embodiment

Figure 4:
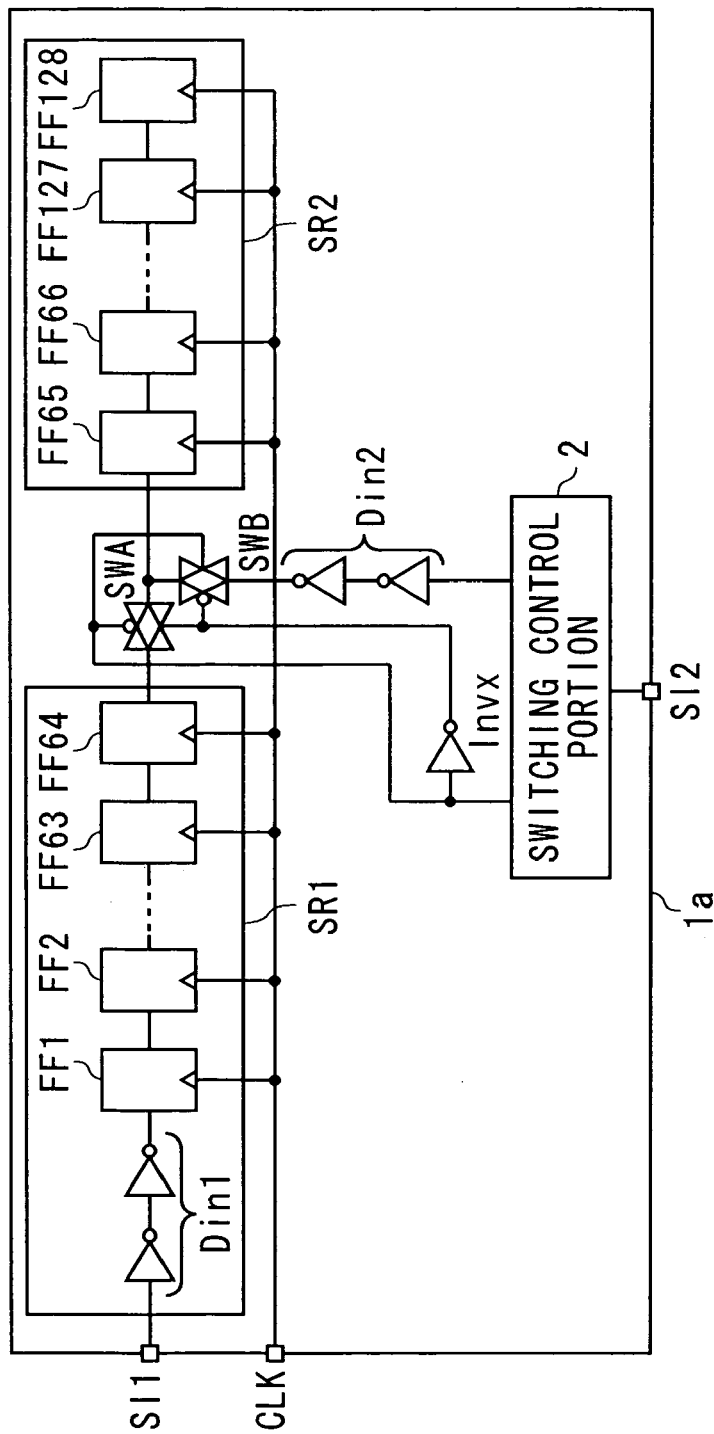
[FIG. 4] A block circuit diagram showing the internal configuration of the semiconductor integrated circuit device provided with the shift registers of a second embodiment.

A second embodiment of the present invention will be described with reference to the drawings. FIG. 4 is a block circuit diagram showing the internal configuration of the semiconductor integrated circuit device of this embodiment. It is to be noted that, in the semiconductor integrated circuit device shown in FIG. 4, such components used for the same purpose as their counterparts in the semiconductor integrated circuit device shown in FIG. 1 are identified with the same reference numerals, and their detailed descriptions will be omitted.

A semiconductor integrated circuit device 1a shown in FIG. 4 includes shift registers SR1 and SR2, input terminals SI1 and SI2, a clock input terminal CLK, an input driver Din2, a transistor switch SWA, a transistor switch SWB, a switching control portion 2 that generates, according to a state of the input terminal SI2, a selection signal for controlling ON/OFF of the switches SWA and SWB, and sends a signal inputted to the input terminal SI2 to the input driver Din2, and an inverter Invx that inverts a selection signal from the switching control portion 2. A selection signal from the switching control portion 2 is inputted to the gate of the MOS transistor Tp of the switch SWA and the gate of the MOS transistor Tn of the switch SWB, and a selection signal inverted by the inverter Invx is inputted to the gate of the MOS transistor Tn of the switch SWA and the gate of the MOS transistor Tp of the switch SWB.

In the semiconductor integrated circuit device 1a configured as described above, the switching control portion 2 operates according to the following three states:

(1) a state in which the input terminal SI2 is not connected to the outside, and no data is inputted (a high-impedance state);

(2) a state in which high level is inputted to the input terminal SI2 as data from the outside (a high-input state); and (3) a state in which low level is inputted to the input terminal SI2 as data from the outside (a low-input state).

(1) In a High-Impedance State

In this state, low level is outputted from the switching control portion 2 as a selection signal, whereby the switch SWA turns ON, and the switch SWB turns OFF. Therefore, data outputted from the flip-flop FF64 of the shift register SR1 is inputted to the input of the flip-flop FF65 of the shift register SR2 via the switch SWA. In this way, the shift registers SR1 and SR2 are coupled together, thereby forming a 128-bit shift register.

(2) In a High-Input State

In this state, high level is outputted from the switching control portion 2 as a selection signal, whereby the switch SWA turns OFF, and the switch SWB turns ON. Furthermore, high level is inputted from the input terminal SI2 as data to the input of the flip-flop FF65 of the shift register SR2 via the input driver Din2 and the switch SWB.

(3) In a Low-Input State

In this state, high level is outputted from the switching control portion 2 as a selection signal, whereby the switch SWA turns OFF, and the switch SWB turns ON. Furthermore, low level is inputted from the input terminal SI2 as data to the input of the flip-flop FF65 of the shift register SR2 via the input driver Din2 and the switch SWB.

As described in (2) or (3), when data is inputted to the input terminal SI2 from the outside, the data from the outside is inputted to the input of the flip-flop FF65 of the shift register SR2 via the switching control portion 2, the input driver Din2, and the switch SWB. In this way, the shift registers SR1 and SR2 are decoupled, thereby forming two separate 64-bit shift registers.

With this configuration, as compared with the semiconductor integrated circuit device 1 of the first embodiment, the semiconductor integrated circuit device 1a of this embodiment allows the selection signal input terminal SEL that receives a selection signal to be omitted. It is to be noted that, instead of a transistor switch, a switch having a different configuration may be used as the transistor switches SWA and SWB.

Another Example of the Configuration of this Embodiment

Figure 5:
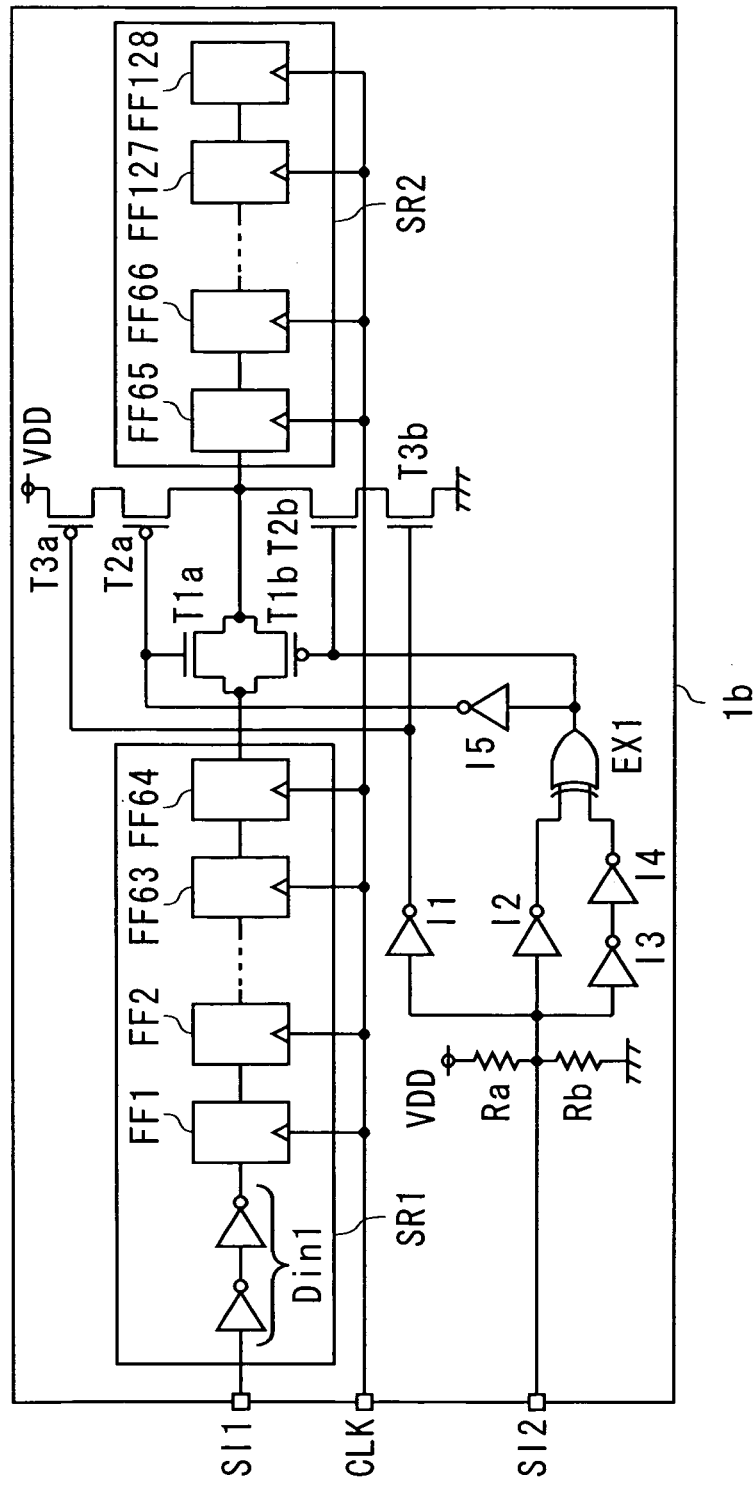
[FIG. 5] A block circuit diagram showing another example of the internal configuration of the semiconductor integrated circuit device provided with the shift registers of the second embodiment.

FIG. 5 shows another example of the configuration of this embodiment. With this configuration, it is possible to omit a transistor switch SWB. A semiconductor integrated circuit device 1b shown in FIG. 5 includes: resistances Ra and Rb each having one end connected to an input terminal SI2; inverters I1 to I3 each connected, on an input side thereof, to a node at which the resistances Ra and Rb are connected together; an inverter I4 that receives an output of the inverter I3; an EXOR circuit EX1 that receives outputs of the inverters I2 and I4; an inverter I5 that receives an output of the EXOR circuit EX1; an N-channel MOS transistor T1a and a P-channel MOS transistor T2a that receive, at the gates thereof, an output from the inverter I5; a P-channel MOS transistor T1b and an N-channel MOS transistor T2b that receive, at the gates thereof, an output of the EXOR circuit EX1; and a P-channel MOS transistor T3a and an N-channel MOS transistor T3b that receive, at the gates thereof, an output from the inverter I1.

In this configuration, a supply voltage VDD is applied to the other end of the resistance Ra, and the other end of the resistance Rb is grounded. Moreover, a threshold value of an input to the inverter I2 at which an output therefrom is turned from high level to low level is set at ¾ VDD, and a threshold value of an input of the inverter I3 at which an output therefrom is turned from high level to low level is set at ¼ VDD. Specifically, when an input to the inverter I2 is in a range of 0 to ¾ VDD, high level is outputted, whereas when an input thereto is in a range of ¾ VDD to VDD, low level is outputted. Moreover, when an input to the inverter I3 is in a range of 0 to ¼ VDD, high level is outputted, whereas when an input thereto is in a range of ¼ VDD to VDD, low level is outputted. Threshold values of an input to the inverters I1, I4, and I5 may be either ¼ VDD or ¾ VDD.

Furthermore, the drain of the MOS transistor T1a and the source of the MOS transistor T1b are connected to the output of the flip-flop FF64 of the shift register SR1, and the source of the MOS transistor T1a and the drain of the MOS transistor T1b are connected to the input of the flip-flop FF65 of the shift register SR2. Moreover, a direct-current voltage VDD is applied to the source of the MOS transistor T3a, and the source of the MOS transistor T2a is connected to the drain of the MOS transistor T3a. The source of the MOS transistor T3b is grounded, and the source of the MOS transistor T2b is connected to the drain of the MOS transistor T3b. The drains of the MOS transistors T2a and T2b are connected to the input of the flip-flop FF65 of the shift register SR2. In this configuration, the MOS transistors T1a and T1b together build transistor switch.

(1) In a High-Impedance State

In this configuration, when the input terminal SI2 is in a high-impedance state in which no data is inputted thereto from the outside, VDD/2 obtained by dividing the direct-current voltage by the resistances Ra and Rb is inputted to the inverters I1 to I3. As a result, high level is outputted from the inverter I2, and low level is outputted from the inverter I3. This makes the inverter I4 that receives the output of the inverter I3 output high level, and the EXOR circuit EX1 that receives the outputs of the inverters I2 and I4 output low level, making the inverter I5 that receives the output of the EXOR circuit EX1 output high level.

Then, the output from the EXOR circuit EX1 that outputs low level is inputted to the gates of the MOS transistors T1b and T2b, turning the MOS transistor T1b ON, and the MOS transistor T2b OFF. Moreover, the output from the inverter I5 that outputs high level is inputted to the gates of the MOS transistors T1a and T2a, turning the MOS transistor T1a ON, and the MOS transistor T2a OFF. Therefore, in this case, the data outputted from the flip-flop FF64 is inputted to the flip-flop FF65 via the transistor switch built with the MOS transistors T1a and T1b.

(2) In a High-Input State

When high level is inputted to the input terminal SI2 as data from the outside, this high level (corresponding to the VDD) is inputted as data to the inverters I1 to I3. Therefore, low level is outputted from the inverters I1 to I3, and high level is outputted from the inverter I4 that receives the output of the inverter I3, making the EXOR circuit EX1 that receives the outputs of the inverters I2 and I4 output high level. Furthermore, the inverter I5 that receives the output of the EXOR circuit EX1 outputs low level.

Then, the output from the EXOR circuit EX1 that outputs high level is inputted to the gates of the MOS transistors T1b and T2b, turning the MOS transistor T1b OFF, and the MOS transistor T2b ON. Moreover, the output from the inverter I5 that outputs low level is inputted to the gates of the MOS transistors T1a and T2a, turning the MOS transistor T1a OFF, and the MOS transistor T2a ON.

Furthermore, the output from the inverter I1 that outputs low level is inputted to the gates of the MOS transistors T3a and T3b, turning the MOS transistor T3a ON, and the MOS transistor T3b OFF. Therefore, in this case, the supply voltage VDD (high level) is inputted to the flip-flop FF65 via the MOS transistors T2a and T3a.

(3) In a Low-Input State

When low level is inputted to the input terminal SI2 as data from the outside, this low level (corresponding to 0) is inputted as data to the inverters I1 to I3. Therefore, the inverters I1 to I3 output high level, and the inverter I4 that receives the output of the inverter I3 outputs low level, making the EXOR circuit EX1 that receives the outputs of the inverters I2 and I4 output high level. Furthermore, the inverter I5 that receives the output of the EXOR circuit EX1 outputs low level.

Then, the output from the EXOR circuit EX1 that outputs high level is inputted to the gates of the MOS transistors T1b and T2b, turning the MOS transistor T1b OFF, and the MOS transistor T2b ON. Moreover, the output from the inverter I5 that outputs low level is inputted to the gates of the MOS transistors T1a and T2a, turning the MOS transistor T1a OFF, and the MOS transistor T2a ON.

Furthermore, the output from the inverter I1 that outputs high level is inputted to the gates of the MOS transistors T3a and T3b, turning the MOS transistor T3a OFF, and the MOS transistor T3b ON. Therefore, in this case, a ground voltage (low level) is inputted to the flip-flop FF65 via the MOS transistors T2b and T3b.

As described in (2) or (3), when data is inputted to the input terminal SI2 from the outside, the transistor switch built with the MOS transistors T1a and T1b is turned OFF, and the data from the outside is inputted to the input of the flip-flop FF65 of the shift register SR2 via the inverter I1 and the MOS transistors T2a, T2b, T3a, and T3b. In this way, the shift registers SR1 and SR2 are decoupled, thereby forming two separate 64-bit shift registers.

Figure 6:
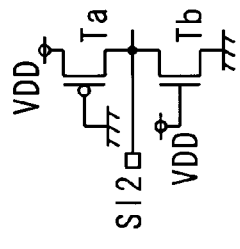
[FIG. 6] A diagram showing the configuration of the resistance that is composed of the MOS transistors and that is included in the semiconductor integrated circuit device of FIG. 5.

In this configuration, as shown in FIG. 6, the resistances Ra and Rb each may be composed of a P-channel MOS transistor Ta having a gate grounded and a source to which a supply voltage VDD is applied, and an N-channel MOS transistor Tb having a gate to which a supply voltage VDD is applied and a source grounded. The drains of these MOS transistors Ta and Tb are connected together, and a node at which they are connected together is connected to the inputs of the inverters I1 to I3.

With the configuration shown in FIG. 5, as compared with the semiconductor integrated circuit device 1 of the first embodiment, it is possible to omit a selection signal input terminal SEL that receives a selection signal, a transistor switch SWB, and an input driver Din2.

This embodiment deals with a case in which two 64-bit shift registers are built in the semiconductor integrated circuit device 1. It should be understood, however, that a shift register of a different number of bits may be used instead of a 64-bit shift register.

Figure 7:
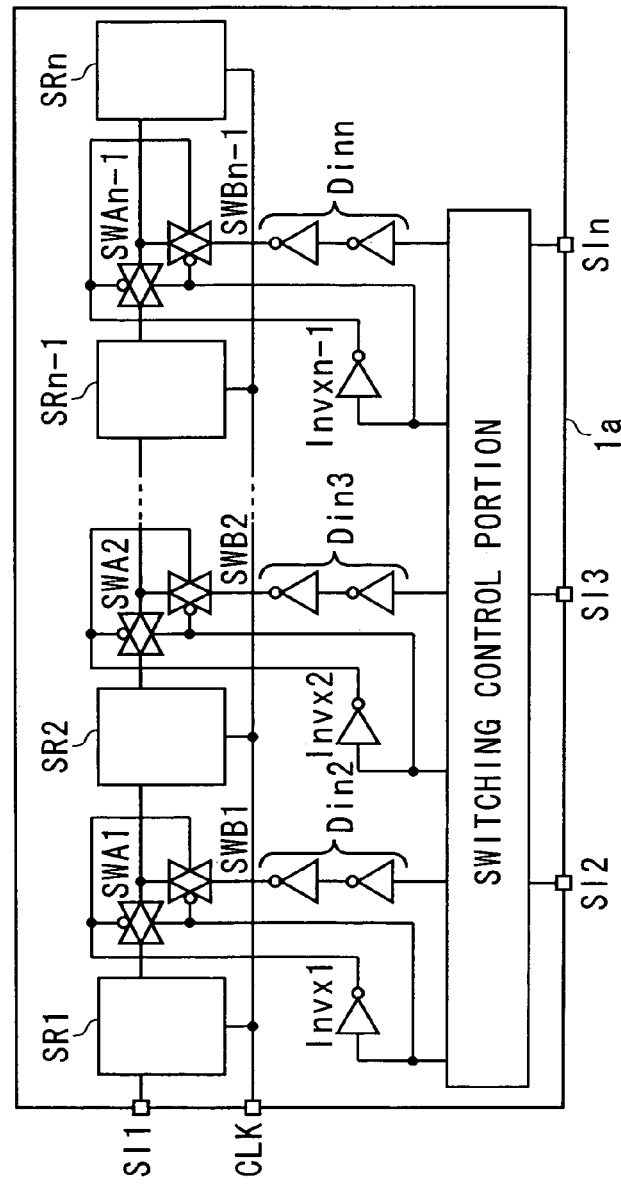
[FIG. 7] A block circuit diagram showing the internal configuration of another example of the semiconductor integrated circuit device provided with the shift registers of the second embodiment.

Furthermore, as shown in FIG. 7, it may be built with n shift registers SR1 to SRn, and there may be provided with n−1 switches SWA1 to SWAn−1 and n−1 switches SWB1 to SWBn−1 between the adjacent shift registers. Moreover, the input terminals SI2 to SIn and the input drivers Din2 to Dinn are used when data is inputted to the shift registers SR2 to SRn from the outside.

In this case, there are provided a switching control portion 20 connected to the input terminals SI2 to SIn, and n−1 inverters Invx1 to Invxn−1 to which n−1 selection signals from the switching control portion 20 are inputted, and the selection signals fed from the switching control portion 20 and the selection signals inverted by the inverters Invx1 to Invxn−1 are inputted to the switches SWA1 to SWAn−1 and the switches SWB1 to SWBn−1. Therefore, by switching ON/OFF of the switches SWA1 to SWAn−1 and the switches SWB1 to SWBn−1 according to a state of the input terminals SI2-1 to SI2-n−1, it is possible to build a shift register of a desired number of bits by decoupling or coupling the shift registers SR1 to SRn.

Furthermore, there may be provided n−1 logic circuits as shown in FIG. 5, each being composed of the inverters I1 to I5, the EXOR circuit EX1, and the MOS transistors T1a to T3a and T1b to T3b, and lying between the input of a shift register and the output of the adjacent one of n shift registers SR1~SRn, and one input terminal for each logic circuit.

What is claimed is:

1. A semiconductor integrated circuit device, comprising:
   first to n-th shift registers;
   first to n-th input terminals that receive data fed to the first to n-th shift registers;
   a first switch that electrically connects and disconnects an output of a k-th shift register (where k is an integer such that $1 \leq k \leq n-1$) and an input of a k+1-th shift register;
   a second switch that electrically connects and disconnects an input of the k+1-th shift register and a k+1-th input terminal that receives data to the k+1-th shift register; and
   a selection signal input terminal that receives a selection signal for switching ON/OFF of the first switch and the second switch,
   wherein, when the k-th shift register and the k+1-th shift register are used in a combined manner, the first switch is turned ON and the second switch is turned OFF by the selection signal, and
   wherein, when the k-th shift register and the k+1-th shift register are used separately, the first switch is turned OFF and the second switch is turned ON by the selection signal.

2. The semiconductor integrated circuit device of claim 1, wherein there is provided an input driver between the k+1-th input terminal and the second switch, and
   wherein there is provided an input driver inside the first shift register.

3. The semiconductor integrated circuit device of claim 1, wherein the first and second switches are transistor switches.

4. A semiconductor integrated circuit device, comprising:
   first to n-th shift registers;
   first to n-th input terminals that receive data fed to the first to n-th shift registers; and
   a switching control portion that performs, according to whether or not a k+1-th input terminal that receives data to a k+1-th shift register (where k is $1 \leq k \leq n-1$) is connected to an outside, switching control of whether an output of the k-th shift register and an input of the k+1-th shift register are connected together, or the k+1-th input terminal and an input of the k+1-th shift register are connected together,
   wherein, when the switching control portion recognizes that the k+1-th input terminal is in an open state in which the k-th input terminal is not connected to the outside, an output of the k-th shift register and an input of the k+1-th shift register are connected together, and the k+1-th input terminal and an input of the k+1-th shift register are disconnected from one another, and
   wherein, when the switching control portion recognizes that the k+1-th input terminal is connected to the outside and data is inputted thereto, an output of the k-th shift register and an input of the k+1-th shift register are disconnected from one another, and the k+1-th input terminal and an input of the k+1-th shift register are connected together.

5. The semiconductor integrated circuit device of claim 4, further comprising:
   a first switch that electrically connects and disconnects an output of the k-th shift register and an input of a k+1-th shift register; and
   a second switch that electrically connects and disconnects an input of the k+1-th shift register and a k+1-th input terminal that receives data to the k+1-th shift register, and wherein the switching control portion outputs a selection signal for switching ON/OFF of the first switch and the second switch.

6. The semiconductor integrated circuit device of claim 5, wherein there is provided, between the second switch and the k+1-th shift register, an input driver to which data inputted from the k+1-th input terminal is fed via the switching control portion, and
wherein there is provided an input driver inside the first shift register.

7. The semiconductor integrated circuit device of claim 5, wherein the first and second switches are transistor switches.

8. The semiconductor integrated circuit device of claim 4, wherein, when the data is in a form of a binary signal that shifts between a first voltage and a second voltage,
the switching control portion includes
　a first resistance having one end connected to the k+1-th input terminal and the other end to which the first voltage is applied,
　a second resistance having one end connected to the k+1-th input terminal and the other end to which the second voltage is applied,
　an external input detection circuit that receives a voltage at a node at which the first and second resistances and the k+1-th input terminal are connected together, the external input detection circuit that outputs a first signal when a voltage obtained by dividing the first and second voltages by the first and second resistances is detected, and outputs a second signal when the first or the second voltage is detected,
　a first switch that turns ON when the first signal is outputted from the external input detection circuit, the first switch connected between an output of the k-th shift register and an input of the k+1-th shift register,
　a first inverter that receives a voltage at a node at which the first and second resistances and the k+1-th input terminal are connected together,
　a first transistor having a second electrode connected to the second voltage and a control electrode connected to an output of the first inverter,
　a second transistor having an opposite polarity to the first transistor, the second transistor having a second electrode connected to the first voltage and a control electrode connected to an output of the first inverter,
　a second switch having one end connected to a first electrode of the first transistor and the other end connected to an input of the k+1-th shift register, the second switch that turns ON when the second signal is inputted thereto from the external input detection circuit, and
　a third switch having one end connected to a first electrode of the second transistor and the other end connected to an input of the k+1-th shift register, the third switch that turns ON when the second signal is inputted thereto from the external input detection circuit, and
wherein, when the first switch is turned ON, the second and third switches are turned OFF, and when the first switch is turned OFF, the second and third switches are turned ON.

9. The semiconductor integrated circuit device of claim 8, wherein the first voltage is higher than the second voltage,
wherein the external input detection circuit includes
　a second inverter that receives a voltage at a node at which the first and second resistances and the k+1-th input terminal are connected together, and that outputs low level corresponding to the second voltage when a voltage that is higher than the voltage obtained by dividing the first and second voltages by the first and second resistances is inputted thereto,
　a third inverter that receives a voltage at a node at which the first and second resistances and the k+1-th input terminal are connected together, and that outputs high level corresponding to the first voltage when a voltage that is lower than the voltage obtained by dividing the first and second voltages by the first and second resistances is inputted thereto,
　a fourth inverter that receives an output of the third inverter, and
　an exclusive OR circuit that receives outputs of the second and fourth inverters, and
wherein, when high level is output from the exclusive OR circuit, the first switch turns OFF and the second and third switches turn ON, and when low level is outputted from the exclusive OR circuit, the first switch turns ON and the second and third switches turn OFF.

* * * * *